(12) United States Patent
Sasaki et al.

(10) Patent No.: US 10,886,108 B2
(45) Date of Patent: Jan. 5, 2021

(54) POWER FEED STRUCTURE AND PLASMA PROCESSING APPARATUS

(71) Applicant: TOKYO ELECTRON LIMITED, Tokyo (JP)

(72) Inventors: Yasuharu Sasaki, Miyagi (JP); Yohei Uchida, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/713,972

(22) Filed: Dec. 13, 2019

(65) Prior Publication Data

US 2020/0194240 A1 Jun. 18, 2020

(30) Foreign Application Priority Data

Dec. 14, 2018 (JP) ................................. 2018-234681

(51) Int. Cl.
*H01J 37/32* (2006.01)

(52) U.S. Cl.
CPC .. *H01J 37/32642* (2013.01); *H01J 37/32174* (2013.01); *H01J 37/32577* (2013.01)

(58) Field of Classification Search
CPC ........... H01J 37/32082; H01J 37/32091; H01J 37/32183; H01J 37/32623; H01J 37/32642
USPC .................................................... 315/111.21
See application file for complete search history.

(56) References Cited

U.S. PATENT DOCUMENTS

| | | | | |
|---|---|---|---|---|
| 6,465,964 B1 * | 10/2002 | Taguchi | ............... | H05H 1/2406 118/723 E |
| 2004/0025791 A1 * | 2/2004 | Chen | ................. | H01J 37/32706 118/728 |
| 2006/0043067 A1 * | 3/2006 | Kadkhodayan | ... | H01J 37/32642 216/67 |
| 2007/0024201 A1 * | 2/2007 | Lee | ................... | H01J 37/32357 315/111.91 |
| 2013/0337655 A1 * | 12/2013 | Lee | ................... | H01L 21/32137 438/715 |
| 2016/0307742 A1 * | 10/2016 | Mishra | .................... | H01J 37/321 |
| 2017/0345625 A1 * | 11/2017 | Lim | ....................... | H01J 37/321 |
| 2018/0090303 A1 * | 3/2018 | Yoon | ................... | H01L 21/3065 |
| 2018/0323042 A1 * | 11/2018 | Wang | ................ | H01L 21/67069 |
| 2020/0027770 A1 * | 1/2020 | Hidaka | .................. | H02N 13/00 |

FOREIGN PATENT DOCUMENTS

JP 2007-258417 A 10/2007

* cited by examiner

*Primary Examiner* — Tung X Le
(74) *Attorney, Agent, or Firm* — Rothwell, Figg, Ernst & Manbeck, P.C.

(57) ABSTRACT

A power feed structure includes a first connecting member group and a ring-shaped first terminal member. The first connecting member group includes a plurality of first connecting members arranged along a circumferential direction of a focus ring disposed in a processing chamber of a plasma processing apparatus to apply a bias potential to the focus ring. The ring-shaped first terminal member is electrically connected to the first connecting members.

8 Claims, 15 Drawing Sheets

POWER FEED STRUCTURE AND PLASMA PROCESSING APPARATUS

CROSS-REFERENCE TO RELATED APPLICATIONS

This application claims priority to Japanese Patent Application No. 2018-234681, filed on Dec. 14, 2018, the entire contents of which are incorporated herein by reference.

TECHNICAL FIELD

The present disclosure relates to a power feed structure and a plasma processing apparatus.

BACKGROUND

A plasma processing apparatus is used for manufacturing electronic devices. Japanese Patent Application Publication No. 2007-258417 discloses an example of the plasma processing apparatus. In the publication, a focus ring is disposed to surround a substrate mounted on an electrostatic chuck. A DC voltage is applied to the focus ring to adjust an upper end position of a sheath on/above the focus ring.

It is expected to provide a power feed structure and a plasma processing apparatus capable of making in-plane distribution of plasma uniform.

SUMMARY

In accordance with an aspect of the present disclosure, there is provided a power feed structure comprising: a first connecting member group including a plurality of first connecting members arranged along a circumferential direction of a focus ring disposed in a processing chamber of a plasma processing apparatus to apply a bias potential to the focus ring; and a ring-shaped first terminal member electrically connected to the first connecting members.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
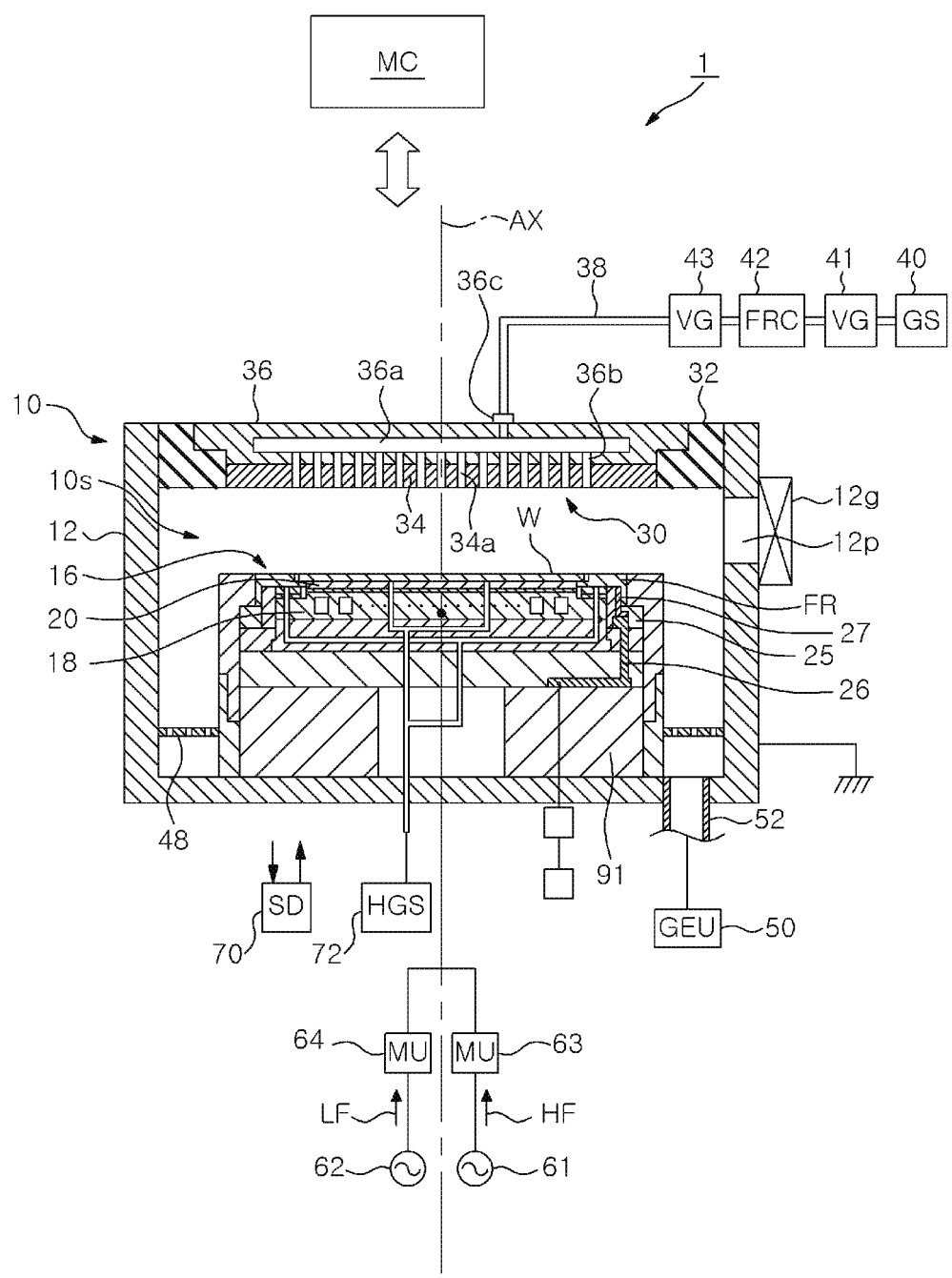
FIG. 1 schematically shows a plasma processing apparatus according to an embodiment.

Hereinafter, various embodiments will be described.

In one embodiment, a substrate support of a plasma processing apparatus is provided. The substrate support includes a first support region, a second support region, a conductive structure, and a holder. The first support region is configured to support a substrate mounted thereon. The second support region is configured to support a focus ring mounted thereon. The second support region extends in a circumferential direction at a radially outer side of the first support region. The conductive structure is configured to be connected to the focus ring. The conductive structure includes a conductive path and a connecting member. The conductive path provides a terminal member at a radially outer side of the second support region, and extends downward from the terminal member. The conductive path electrically connects the focus ring and the terminal member. The connecting member is disposed on the terminal member to face a surface of the focus ring extending downward at a radially outer side of the connecting member. The holder presses the connecting member downward and holds the connecting member to press the surface of the focus ring against the connecting member.

In the substrate support according to the embodiment, the connecting member is pressed downward by the holder, so that the connecting member and the terminal member are electrically connected reliably. Further, the connecting member held by the holder presses the surface of the focus ring which is positioned at a radially outer side of the connecting member. Therefore, the connecting member and the focus ring are electrically connected reliably. The connecting member presses the surface of the focus ring in a direction substantially orthogonal to a direction in which an electrostatic attractive force generated between the chuck region and the focus ring is exerted. Accordingly, an electrical path that can be connected to the focus ring while suppressing generation of a force against the electrostatic attractive force for holding the focus ring is provided. In this substrate support, the focus ring is stably held in the second support region.

In one embodiment, the connecting member may have a first portion and a second portion. The first portion faces the surface of the focus ring. The second portion extends radially outward from the lower end of the first portion. The holder holds the connecting member to press the second portion downward. In this embodiment, when the second portion is pressed downward, the first portion exerts a force radially outward.

In one embodiment, the substrate support may further include a conductive member. The conductive member has elasticity and is held between the connecting member and the terminal member.

In one embodiment, the substrate support may further include another conductive member. This conductive member has elasticity and is held between the connecting member and the surface of the focus ring.

In one embodiment, the substrate support may further include a focus ring.

In one embodiment, the focus ring may have a first annular portion and a second annular portion. The first annular portion has an annular plate shape, and is disposed on the second support region. The second annular portion includes the surface of the focus ring, and extends downward from the first annular portion to face the connecting member.

In one embodiment, the holder may have an insulating property. The connecting member may be shielded by the focus ring and the holder. In this embodiment, the connecting member is protected from the plasma.

In one embodiment, the second support region may include a chuck region. The chuck region is configured to hold the focus ring using an electrostatic attractive force. In this embodiment, the focus ring is firmly held on the chuck region of the second support region.

In one embodiment, a gas line for supplying a heat transfer gas to a gap between the chuck region and the focus ring may passes through the second support region. In this embodiment, heat exchange between the second support region and the focus ring that are in contact with each other is facilitated.

In another embodiment, a plasma processing apparatus is provided. The plasma processing apparatus includes a chamber, the substrate support, a high frequency power supply, and another power supply. The substrate support is configured to support the substrate and the focus ring in the chamber. The high frequency power supply is electrically connected to a lower electrode of the substrate support. The power supply is electrically connected to a conductive structure outside the chamber. The power supply is configured to apply a negative voltage to the focus ring.

In still another embodiment, the substrate support of the plasma processing apparatus is provided. The substrate support includes the first support region, the second support region, and the conductive structure. The first support region is configured to support the substrate mounted thereon. The second support region is configured to support the focus ring mounted thereon. The second support region extends in the circumferential direction at the radially outer side of the first support region. The conductive structure is configured to be connected to the focus ring. The conductive structure includes the conductive path and the connecting member. The conductive path provides the terminal member. The connecting member electrically connects the focus ring and the terminal member. The connecting member is disposed on the terminal member to face the surface of the focus ring extending downward at the radially outer side of the connecting member. The connecting member presses the terminal member and the focus ring.

In further still another embodiment, a focus ring is provided. The focus ring has a first annular portion and a second annular portion. The second annular portion extends downward from the outer peripheral portion of the first annular portion.

In one embodiment, a power feed structure is provided. The power feed structure includes a first connecting member group and a first terminal member. The first connecting member group includes a plurality of first connecting members arranged along the circumferential direction of the focus ring disposed in a processing chamber of the plasma processing apparatus to apply a bias potential to the focus ring. The first terminal member has a ring shape and is electrically connected to the first connecting members.

When the bias potential is applied to the focus ring, the high frequency power for plasma generation is superimposed on a bias potential supply line. When there is one bias potential supply line, the superimposed high frequency power flows through the supply line and the in-plane distribution of plasma becomes non-uniform. Therefore, in the present embodiment, the first connecting members are arranged along the circumferential direction of the focus ring and electrically connected to the ring-shaped first terminal member. Accordingly, the circumferential distribution of the high frequency power flowing through the first connecting members can become uniform, and the uneven in-plane distribution of plasma can be suppressed.

In one embodiment, the first terminal member is separated from the inner wall surface of the processing chamber to which a fixed potential is applied. The first terminal member serving as the bias potential supply line is affected by the potential of the processing chamber. The potential of the processing chamber is set to a fixed potential such as a ground potential or the like. Therefore, when the ring-shaped first terminal member is separated from the inner wall surface of the processing chamber, the potential of the first terminal member is stabilized in the circumferential direction. Accordingly, the uneven in-plane distribution of plasma can be further suppressed.

In one embodiment, the power feed structure includes a ring-shaped second terminal member separated from the first terminal member and electrically connected to the first terminal member, and a second connecting member group including a plurality of second connecting members that connect the first terminal member and the second terminal member.

Since this structure includes the ring-shaped second terminal member and the second connecting member group including the second connecting members, the circumferential distribution of the high frequency power flowing therethrough can become uniform, similarly to the case of the ring-shaped first terminal member and the first connecting member group. By providing the ring-shaped terminal members at multiple stages, the in-plane uneven distribution of plasma can be further suppressed.

In one embodiment, the positions of the first connecting members of the first connecting member group and the positions of the second connecting members of the second connecting member group are shifted along the circumferential direction of the focus ring in a plan view. Therefore, the distribution of the current flowing through the first connecting members of the first connecting member group and the distribution of the current flowing through the second connecting members of the second connecting member group are shifted in the circumferential direction in a plan view. Accordingly, the overall in-plane distribution of the current becomes uniform. As a result, uneven in-plane distribution of plasma can be further suppressed.

In one embodiment, the plasma processing apparatus may include one of the above-described power feed structures. In accordance with the plasma processing apparatus, the uneven in-plane distribution of plasma can be suppressed.

Hereinafter, various embodiments will be described in detail with reference to the accompanying drawings. Like reference numerals will be used for like or corresponding parts throughout the drawings.

FIG. 1 schematically shows a plasma processing apparatus according to an embodiment. A plasma processing apparatus 1 shown in FIG. 1 is a capacitively coupled plasma processing apparatus. The plasma processing apparatus 1 includes a chamber (processing chamber) 10. The chamber 10 has therein an inner space 10s. In one embodiment, the chamber 10 includes a chamber body 12. The chamber body 12 has a substantially cylindrical shape. The inner space 10s is formed in the chamber body 12. The chamber body 12 is made of, e.g., aluminum. The chamber body 12 is electrically grounded. A plasma-resistant film is formed on an inner wall surface of the chamber body 12, i.e., the wall surface defining the inner space 10s. This film may be a film formed by anodic oxidation treatment or a ceramic film made of yttrium oxide.

A passage is formed at the sidewall of the chamber body 12. The substrate W is transferred between the inner space 10s and the outside of the chamber 10 through the passage 12p. A gate valve 12g is provided along the sidewall of the chamber body 12 to open and close the passage 12p.

A substrate support 16 is disposed in the chamber 10. The substrate support 16 is configured to support the substrate W mounted thereon. The substrate W has a substantially disc shape. The substrate support 16 includes a lower electrode 18 and a chuck region 20 for the substrate. The lower electrode 18 is made of a conductive material such as aluminum and has a substantially disc shape. The chuck region 20 is provided on the lower electrode 18. The chuck region 20 is configured to hold the substrate W by an electrostatic attractive force generated between the substrate W mounted thereon and the chuck region 20. The substrate support 16 will be described in detail later.

The plasma processing apparatus 1 may further include an upper electrode 30. The upper electrode 30 is disposed above the substrate support 16. The upper electrode 30 closes an upper opening of the chamber body 12 together with an insulating member 32. The upper electrode 30 is supported at an upper portion of the chamber body 12 through the insulating member 32.

The upper electrode 30 includes a ceiling plate 34 and a holder 36. A bottom surface of the ceiling plate 34 defines the inner space 10s. A plurality of gas injection holes 34a is formed in the ceiling plate 34. Each of the gas injection holes 34a penetrates through the ceiling plate 34 in a plate thickness direction (vertical direction). The ceiling plate 34 is made of, e.g., silicon, but is not limited thereto. Alternatively, the ceiling plate 34 may have a structure in which a plasma-resistant film is formed on a surface of an aluminum base material. This film may be a film formed by anodic oxidation treatment or a ceramic film made of yttrium oxide.

The holder 36 detachably holds the ceiling plate 34. The holder 36 is made of a conductive material such as aluminum. A gas diffusion space 36a is provided inside the holder 36. A plurality of gas holes 36b extends downward from the gas diffusion space 36a. The gas holes 36b communicate with the respective gas injection holes 34a. A gas inlet port 36c is formed in the holder 36. The gas inlet port 36c is connected to the gas diffusion space 36a. A gas supply line 38 is connected to the gas inlet port 36c.

A gas source group (GS) 40 is connected to the gas supply line 38 through a valve group (VG) 41, a flow rate controller group (FRC) 42 and a valve group (VG) 43. The gas source group 40, the valve group 41, the flow rate controller group 42, and the valve group 43 constitute a gas supply unit. The gas source group 40 includes a plurality of gas sources. Each of the valve group 41 and the valve group 43 includes a plurality of valves (e.g., on-off valves). The flow rate controller group 42 includes a plurality of flow rate controllers. Each of the flow rate controllers of the flow rate controller group 42 is a mass flow controller or a pressure control type flow controller. The gas sources of the gas source group 40 are respectively connected to the gas supply line 38 through corresponding valves of the valve group 41, corresponding flow controllers of the flow rate control group 42, and corresponding valves of the valve group 43. The plasma processing apparatus 1 can supply gases from one or more gas sources selected among the plurality of gas sources of the gas source group 40 to the inner space 10s at individually controlled flow rates.

A baffle plate 48 is provided between a tubular member (which will be described later) of the substrate support 16 and the sidewall of the chamber body 12. The baffle plate 48 may be formed by coating ceramic such as yttrium oxide on an aluminum base material, for example. A plurality of through-holes is formed in the baffle plate 48. Below the baffle pate 48, a gas exhaust line 52 is connected to the bottom portion of the chamber body 12. A gas exhaust unit (GEU) 50 is connected to the gas exhaust line 52. The gas exhaust unit 50 includes pressure controller such as an automatic pressure control valve, and a vacuum pump such as a turbo molecular pump or the like, and thus can decrease a pressure in the inner space 10s.

The plasma processing apparatus 1 further includes one or more high frequency power supplies. In one embodiment, the plasma processing apparatus 1 may further include a high frequency power supply 61. The high frequency power supply 61 generates a high frequency power HF for plasma generation. The high frequency power HF has a frequency ranging from 27 to 100 MHz, e.g., 40 MHz or 60 MHz. The high frequency power supply 61 is connected to the lower electrode 18 via a matching unit (MU) 63 to supply the high frequency power HF to the lower electrode 18. The matching unit 63 has a matching circuit for matching an output impedance of the high frequency power supply 61 and an impedance of a load side (the lower electrode 18 side). The high frequency power supply 61 may not be electrically connected to the lower electrode 18 and may be connected to the upper electrode 30 via the matching unit 63.

In one embodiment, the plasma processing apparatus 1 may further include a high frequency power supply 62. The high frequency power supply 62 generates a bias high frequency power, i.e., a high frequency power LF, for attracting ions to the substrate W. The frequency of the high frequency power LF is lower than the frequency of the high frequency power HF. The frequency of the high frequency power LF is within a range from 400 kHz to 13.56 MHz, e.g., 400 kHz. The high frequency power supply 62 is connected to the lower electrode 18 via a matching unit (MU) 64 to supply the high frequency power LF to the lower electrode 18. The matching unit 64 has a matching circuit for matching an output impedance of the high frequency power supply 62 and the impedance of the load side (the lower electrode 18 side).

In the plasma processing apparatus 1, a gas is supplied to the inner space 10s. Then, the gas is excited in the inner space 10s by supplying the high frequency power HF and/or the high frequency power LF. As a result, plasma is generated in the inner space 10s. The substrate W is processed by ions and/or radicals in the generated plasma.

The plasma processing apparatus 1 may further include a control unit MC. The control unit MC is a computer including a processor, a storage device, an input device, a display device and the like, and controls the respective components of the plasma processing apparatus 1. Specifically, the control unit MC executes a control program stored in the storage device, and controls the respective components of the plasma processing apparatus 1 based on a recipe data stored in the storage device. In the plasma processing apparatus 1, a process specified by the recipe data is performed under the control of the control unit MC.

Figure 2:
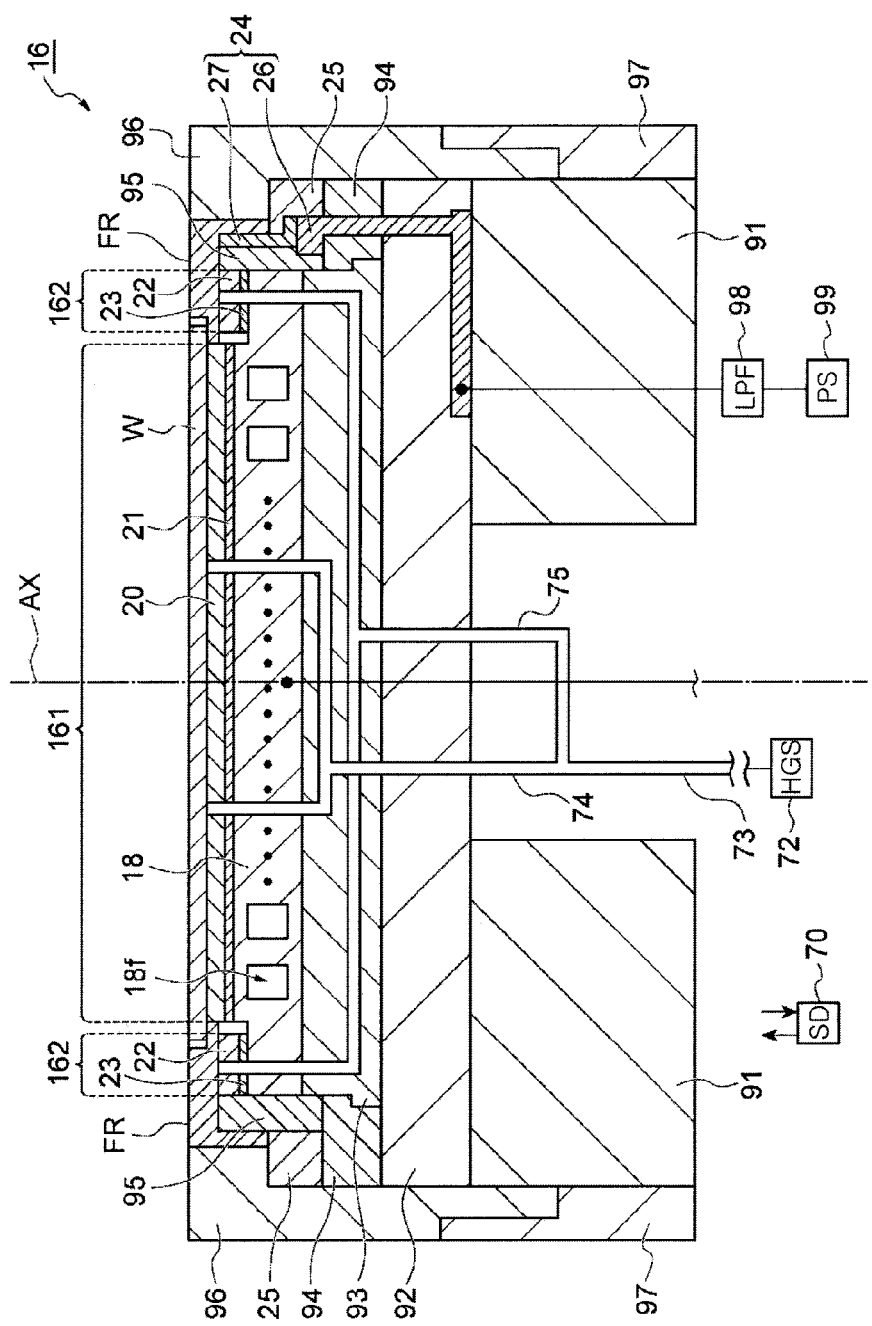
FIG. 2 is a cross-sectional view of a substrate support according to an embodiment.
Figure 3:
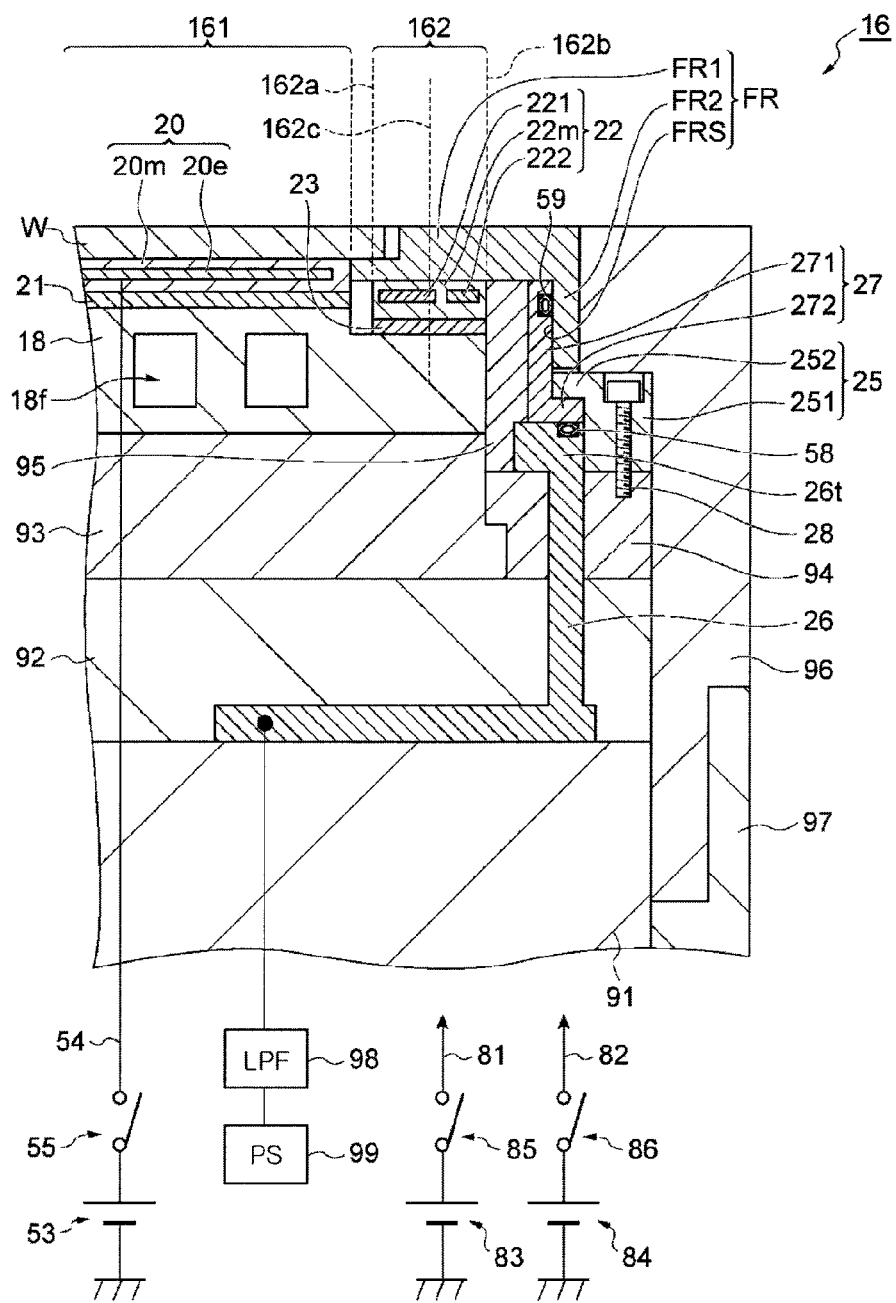
FIG. 3 is a partially enlarged cross-sectional view of the substrate support according to the embodiment.

Hereinafter, the substrate support 16 will be described in detail with reference to FIGS. 2 and 3 in addition to FIG. 1. FIG. 2 is a cross-sectional view of the substrate support according to the embodiment. FIG. 3 is a partially enlarged cross-sectional view of the substrate support according to the embodiment. As described above, the substrate support 16 includes the lower electrode 18 and the chuck region 20.

A flow path 18f is formed in the lower electrode 18. The flow path 18f is a flow path for a heat exchange medium. As for the heat exchange medium, a liquid coolant or a coolant (e.g., Freon) that is vaporized to cool the lower electrode 18 is used. A supply device (SD) 70 (e.g., a chiller unit) for the heat exchange medium is connected to the flow path 13f. The heat exchange medium is supplied to the flow path 13f from the supply device 70 through a line. The heat exchange medium supplied to the flow path 18f is returned to the supply device 70 through another line.

The substrate support 16 has a first support region 161 and a second support region 162. The first support region 161 is configured to support the substrate W mounted thereon. The first support region 161 includes the lower electrode 18 and the chuck region 20. In other words, the first support region 161 includes a part of the lower electrode 18 and the chuck region 20. An axis AX that is the central axis of the first support region 161 extends in the vertical direction. The first support region 161 has a substantially circular planar shape.

The chuck region 20 is disposed on the lower electrode 18. The chuck region 20 has a substantially disc shape. The chuck region 20 is bonded to the upper surface of the lower electrode 18 via a bonding region 21. The bonding region 21 is made of, e.g., an adhesive agent.

The chuck region 20 includes a main body 20m and an electrode 20e. The main body 20m has a substantially disc shape. The main body 20m is made of a dielectric material such as aluminum nitride. The electrode 20e is a film-shaped electrode. The electrode 20e is disposed in the main body 20m. The electrode 20e is electrically connected to a DC power supply 53 through a conducting wire 54. The electrode 20e may be electrically connected to the DC power supply 53 through the conducting wire 54 and a switch 55.

The substrate W is mounted on the upper surface of the chuck region 20. When a voltage from the DC power supply 53 is applied to the electrode 20e, an electrostatic attractive force is generated between the substrate W and the chuck region 20. The substrate W is held on the chuck region 20 by the generated electrostatic attractive force.

In one embodiment, the plasma processing apparatus 1 may include a heat transfer gas supply system. The heat transfer gas supply system is configured to supply a heat transfer gas, e.g., He gas, to a gap between the substrate W and the chuck region 20. In one embodiment, the heat transfer gas supply system includes a heat transfer gas source (HGS) 72. A gas line 73 is connected to the source 72. A gas line 74 is branched from the gas line 73. The gas line 74 is extended to supply the heat transfer gas from the source 72 to the gap between the substrate W and the chuck region 20.

The second support region 162 is configured to support the focus ring FR mounted thereon. The second support region 162 extends outside the first support region 161 in a radial direction with respect to the axis AX. The second support region 162 extends in a circumferential direction about the axis AX. The second support region 162 has an annular planar shape.

The second support region 162 includes the lower electrode 18, a focus ring chuck region 22, and the bonding region 23. In other words, the second support region 162 includes another part of the lower electrode 18, i.e., a peripheral portion of the lower electrode 18, the chuck region 22, and the bonding region 23. The chuck region 22 is disposed above the peripheral portion of the lower electrode 18. The chuck region 22 extends in the circumferential direction to surround the chuck region 20. The bonding region 23 has an insulating property and is disposed between the chuck region 22 and the lower electrode 18. In one example, the bonding region 23 serves as an adhesive agent that allows the chuck region 22 to adhere to the upper surface of the lower electrode 18.

Figure 4:
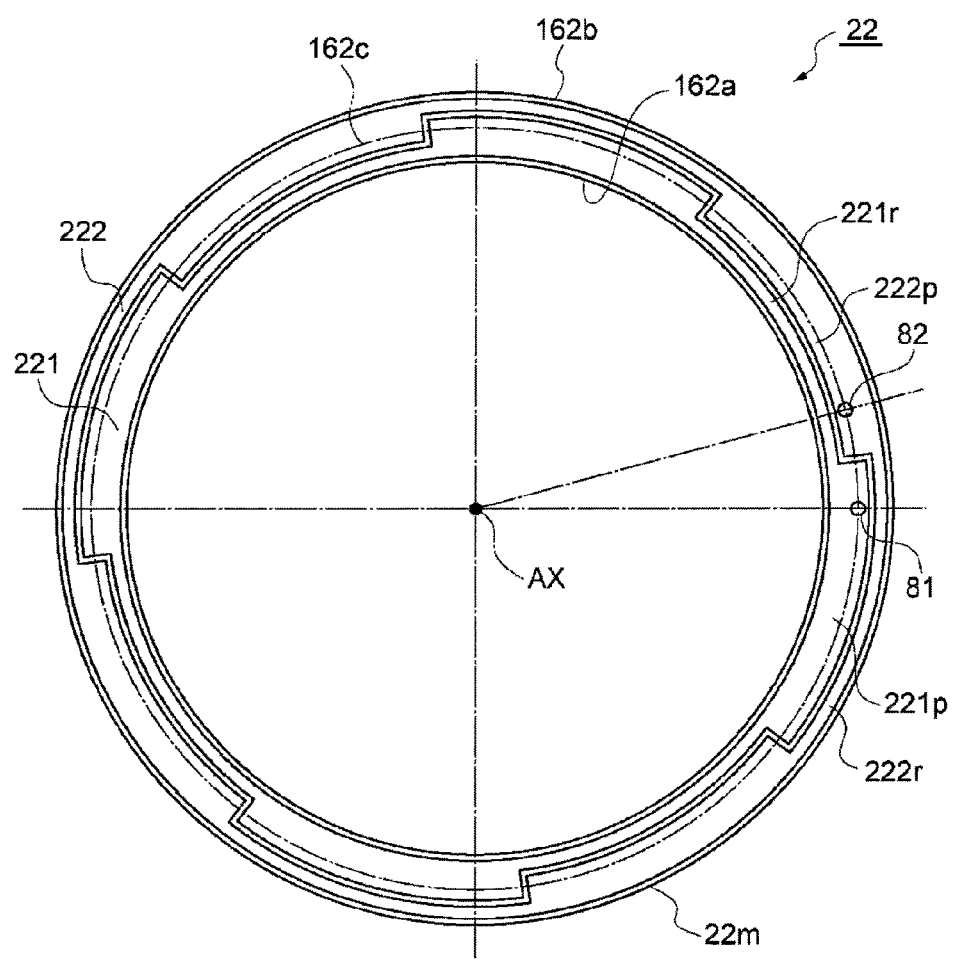
FIG. 4 schematically shows a layout of a first electrode and a second electrode in a chuck region for a focus ring of the substrate support according to the embodiment.
Figure 5A:
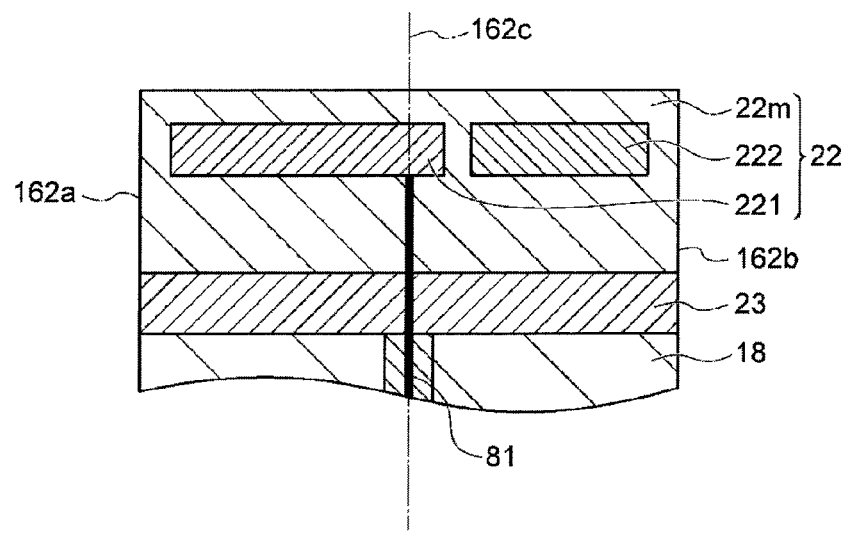
FIGS. 5A and 5B are partially enlarged cross-sectional views of the substrate support according to the embodiment.
Figure 5B:
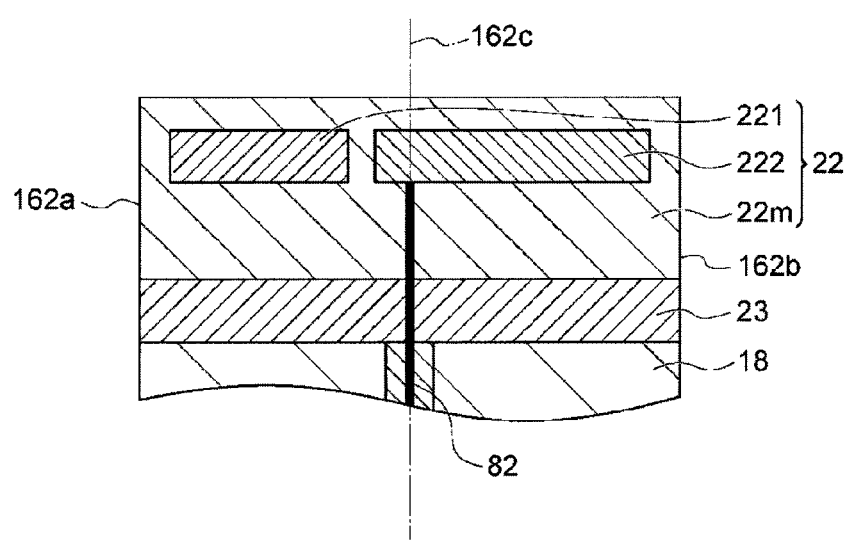

Hereinafter, FIGS. 4, 5A, and 5B will be referred in addition to FIGS. 1 to 3. FIG. 4 schematically shows a layout of a first electrode and a second electrode in the focus ring chuck region of the substrate support according to the embodiment. FIGS. 5A and 5B are partially enlarged cross-sectional views of the substrate support according to the embodiment. FIG. 5A is an enlarged view of a part of the substrate support including a connecting portion between the first electrode and a first conducting wire. FIG. 5B is an enlarged view of a part of the substrate support including a connecting portion between the second electrode and a second conducting wire.

The chuck region 22 is configured to hold the focus ring FR mounted thereon. The focus ring FR is made of a conductive material. The focus ring FR is made of, e.g., silicon or silicon carbide. The focus ring FR has an annular planar shape. In the plasma processing apparatus 1, the substrate W is disposed on the chuck region 20 and in a region surrounded by the focus ring FR.

The chuck region 22 includes a main body 22m, a first electrode 221, and a second electrode 222. The main body 22m has an annular plate shape defined by an inner edge and an outer edge thereof. The main body 22m is made of a dielectric material such as aluminum nitride. The inner edge and the outer edge of the main body 22m correspond to the inner edge and the outer edge of the chuck region 22. An inner boundary 162a of the second support region 162 is formed in a cylindrical shape and includes the inner edge of the chuck region 22. An outer boundary 162b of the second support region 162 is formed in a cylindrical shape and includes the outer edge of the chuck region 22.

The first electrode 221 and the second electrode 222 are film-shaped electrodes. The first electrode 221 and the second electrode 222 are disposed in the main body 22m. The first electrode 221 and the second electrode 222 extend in the circumferential direction around the axis AX. The first electrode 221 extends inside the second electrode 222. The first electrode 221 and the second electrode 222 are separated from each other. The first electrode 221 and the second electrode 222 may have the same or substantially the same area. When the first electrode 221 and the second electrode 222 have the same or substantially the same area, the electrostatic attractive force can be maximized.

The substrate support 16 further includes a first conducting wire 81 and a second conducting wire 82. The first conducting wire 81 electrically connects the first electrode 221 to the DC power supply 83. The first electrode 221 may be electrically connected to the DC power supply 83 through the first conducting wire 81 and a switch 85. The second conducting wire 82 electrically connects the second electrode 222 to the DC power source 84. The second electrode 222 may be electrically connected to the DC power supply 84 through the second conductor 82 and a switch 86.

A focus ring FR is mounted on the upper surface of the chuck region 22. When voltages are applied from the DC power supply 83 and the DC power supply 84 to the first electrode 221 and the second electrode 222 so that a potential difference is generated between the first electrode 221 and the second electrode 222, an electrostatic attractive force is generated. The focus ring FR is held on the chuck region 22 by the generated electrostatic attractive force.

In one embodiment, the above-described heat transfer gas supply system is configured to supply a heat transfer gas to a gap between the focus ring FR and the chuck region 22. A gas line 75 is branched from the gas line 73. The gas line 75 is extended to supply a heat transfer gas from the source 72 to the gap between the focus ring FR and the chuck region 22. A part of the gas line 75 extends through the second support region 162. In the present embodiment, heat exchange between the second support region 162 (i.e., the chuck region 22) and the focus ring FR is facilitated by the heat transfer gas.

As shown in FIG. 5A, the first conducting wire 81 is connected to the first electrode 221 through the bonding region 23. As shown in FIG. 5B, the second conducting wire is connected to the second electrode 222 through the bonding region 23. The first conducting wire 81 and the second conducting wire 82 extend in the vertical direction in the bonding region 23. Each of the first conducting wire 81 and the second conducting wire 82 may extend through the lower electrode 18. In the lower electrode 18, each of the first conducting wire 81 and the second conducting wire 82 are electrically separated from the lower electrode 18. In the lower electrode 18, each of the first conductor 81 and the second conductor 82 may be surrounded by an insulator.

In the bonding region 23, the first conducting wire 81 and the second conducting wire 82 extend at positions closer to a central portion 162c than the inner boundary 162a and the outer boundary 162b of the second support region 162. The first conducting wire 81 and the second conducting wire 82 may extend on the central portion 162c. The central portion 162c is located at the center between the inner boundary 162a and the outer boundary 162b of the second support region 162. In other words, the central portion 162c is radially spaced apart from the inner boundary 162a and the outer boundary 162b by an equal distance. Therefore, the central portion 162c has a cylindrical shape.

In the plasma processing apparatus 1, each of the first conducting wire 81 and the second conducting wire 82 are disposed in the bonding region 23 to be spaced apart from the inner boundary 162a and the outer boundary 162b of the second support region 162 by large distances. Therefore, it is possible to ensure a large distance between a plasma space and each of the first conducting wire 81 and the second conducting wire 82. In other words, a large distance can be ensured between the first conducting wire 81 and the inner edge of the bonding region 23 and between the first conducting wire 81 and the outer edge of the bonding region 23. In addition, a large distance can be ensured between the second conducting wire 82 and the inner edge of the bonding region 23 and between the second conducting wire 82 and the outer edge of the bonding region 23.

In one embodiment, as described above, the first conducting wire 81 and the second conducting wire 82 may extend on the central portion 162c in the bonding region 23. In accordance with this embodiment, the distance between the plasma space and each of the first conductor 81 and the second conductor 82 becomes the maximum.

In one embodiment, the first electrode 221 may have a first protrusion 221p. As shown in FIG. 4, the first protrusion 221p extends outward from the central portion 162c so that the first electrode 221 can expand outward with respect to the central portion 162c. In this embodiment, the second electrode 222 has a second recess 222r extending along the first protrusion 221p. The first conducting wire 81 is connected to the first protrusion 221p. The first conducting wire 81 extends downward from the first protrusion 221p. In other words, the first protrusion 221p is a contact portion of the first electrode 221 and the first conducting wire 81.

In one embodiment, the second electrode 222 may have a second protrusion 222p. As shown in FIG. 4, the second protrusion 222p extends inward from the central portion 162c so that the second electrode 222 can expand inward with respect to the central portion 162c. The first electrode 221 has a first recess 221r extending along the second protrusion 222p. The second conducting wire 82 is connected to the second protrusion 222p. The second conducting wire 82 extends downward from the second protrusion 222p. In other words, the second protrusion 222p is a contact portion of the second electrode 222 and the second conducting wire 82.

As shown in FIG. 4, the first electrode 221 may be formed to alternately provide a plurality of protrusions including the first protrusion 221p and a plurality of recesses including the first recess 221r in the circumferential direction. Further, the second electrode 222 may be formed to alternately provide a plurality of protrusions including the second protrusion 222p and a plurality of recesses including the second recess 222r in the circumferential direction.

Figure 6:
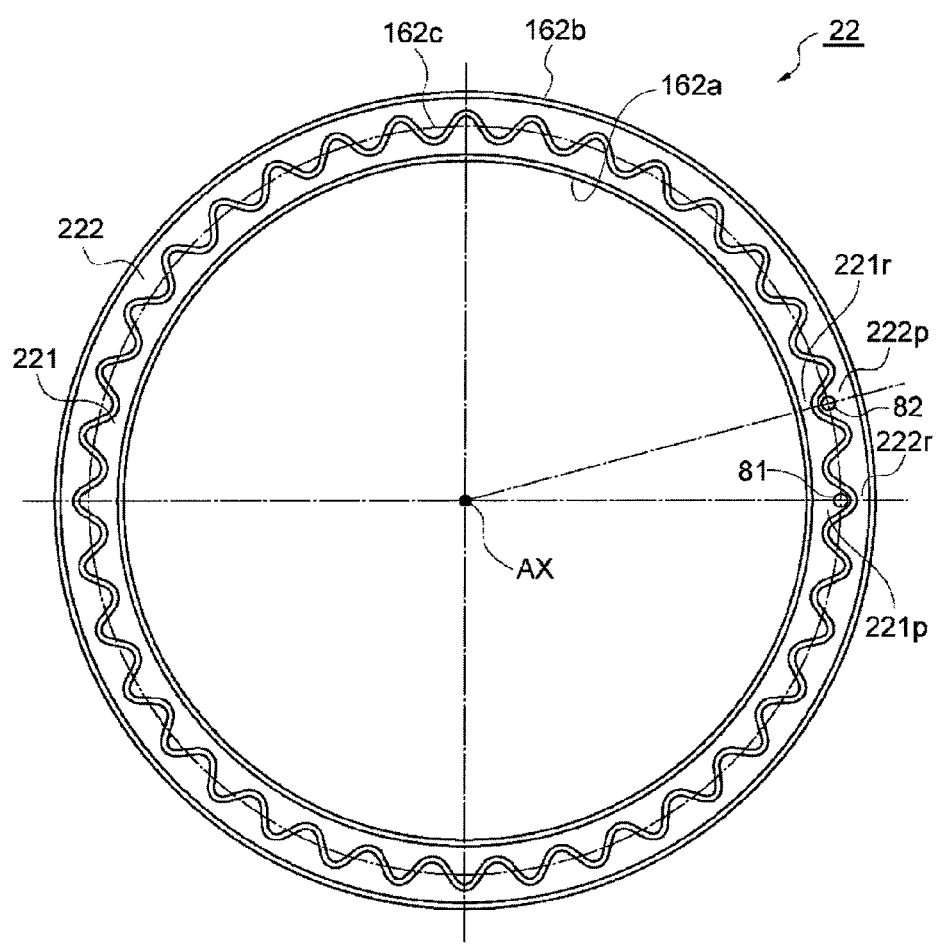
FIG. 6 schematically shows a layout of a first electrode and a second electrode in a chuck region of a substrate support according to another embodiment.
Figure 7:
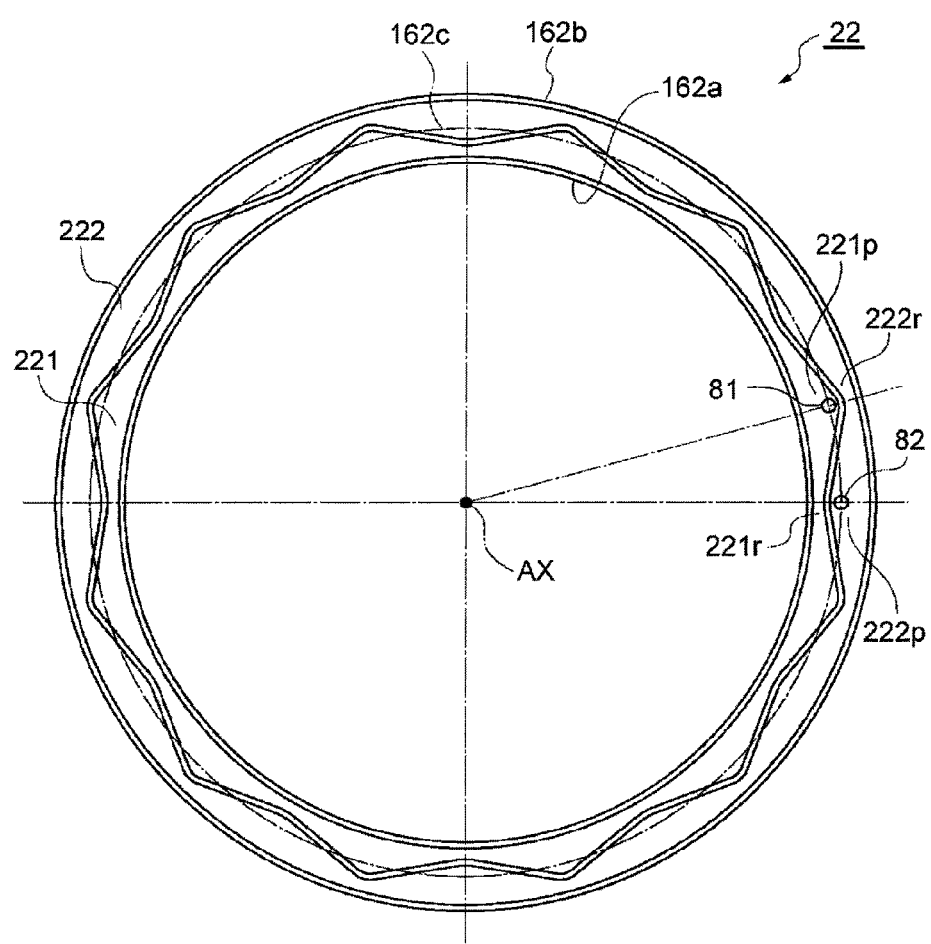
FIG. 7 schematically shows a layout of a first electrode and a second electrode in a chuck region of a substrate support according to still another embodiment.

Hereinafter, description will be given with reference to FIGS. 6 and 7. FIGS. 6 and 7 schematically show a layout of a first electrode and a second electrode in a chuck region of a substrate support according to another embodiment. As shown in FIGS. 6 and 7, the outer edge of the first electrode 221 and the inner edge of the second electrode 222 may be formed in a wave shape. In the embodiments shown in FIGS. 6 and 7, the outer edge of the first electrode 221 extends alternately at the inner side and the outer side with respect to the central portion 162c along the circumferential direction. The inner edge of the second electrode 222 extends alternately at the inner side and the outer side with respect to the central portion 162c along the circumferential direction and also extends along the outer edge of the first electrode 221. As shown in FIGS. 6 and 7, the outer edge of the first electrode 221 and the inner edge of the second electrode 222 may have a curved shape or a polygonal shape.

The chuck region 22 shown in FIGS. 1 to 7 is separated from the chuck region 20. However, the substrate support 16 may have one electrostatic chuck in which the chuck region 20 and the chuck region 22 are integrated. In other words, the chuck region 20 and the chuck region 22 may be integrated.

Referring back to FIGS. 1 to 3, in one embodiment, the plasma processing apparatus 1 is configured to be able to apply a voltage to the focus ring FR. When a negative voltage is applied to the focus ring FR, the upper end position of the sheath on the focus ring FR is adjusted. The substrate support 16 further includes a conductive structure 24 and a holder 25. The conductive structure 24 is configured to be electrically connected to the focus ring FR. The conductive structure 24 includes a conductive path 26 and a connecting member 27.

The conductive path 26 provides a terminal member 26t at a radially outer side of the second support region 162. The conductive path 26 extends downward from the terminal member 26t. The conductive path 26 includes one or more conductors. In one embodiment, the plasma processing apparatus 1 may further include an insulating region. The insulating region extends downward at a radially outer side of the second support region 162 and below the lower electrode 18. The conductive path 26 extends in the insulating region.

In one embodiment, the insulating region includes a plurality of insulating members 91 to 96. The number of insulating members constituting the insulating region may vary. The insulating members 91 to 96 are made of quartz or aluminum oxide. The insulating member 91 has a substantially cylindrical shape. The insulating member 91 extends upward from a bottom portion of the chamber 10. Each of the insulating members 92 and 93 have a substantially disc shape. The diameter of the insulating member 92 is greater than that of the insulating member 93. The insulating member 93 is disposed on the insulating member 92. The lower electrode 18 is disposed on the insulating member 93.

The insulating member 94 has a substantially ring shape. The insulating member 94 is disposed on the peripheral portion of the insulating member 92. The insulating member 94 is disposed at a radially outer side of the insulating member 93. The insulating member 94 extends in the circumferential direction along the outer peripheral surface of the insulating member 93. The insulating member 95 has a substantially cylindrical shape. The insulating member 95 has an outer diameter smaller than that of the insulating member 94. The insulating member 95 is disposed on the insulating member 94. The insulating member 95 extends along the outer peripheral surface of the lower electrode 18 and the outer edge of the chuck region 22.

The tubular member 97 extends upward from the bottom portion of the chamber 10. The tubular member 97 has a substantially cylindrical shape. The tubular member 97 extends along the outer peripheral surface of the insulating member 91. The tubular member 97 is made of a metal such as aluminum. The tubular member 97 is grounded in the same manner as the chamber 10. The insulating member 96 has a substantially cylindrical shape. The insulating member 96 is disposed on the tubular member 97. The insulating member 96 extends along the outer peripheral surface of the insulating member 92, the outer peripheral surface of the insulating member 94, the outer peripheral surface of the holder 25, and the outer peripheral surface of the focus ring FR.

In one embodiment, the conductive path 26 provides the terminal member 26t on the insulating member 94. The conductive path 26 extends downward through the insulating members 94 and 92. A power supply (PS) 99 is electrically connected to the conductive path 26 through a low pass filter (LPF) 98. The low pass filter 98 is configured to attenuate or block a high frequency flowing into the power supply 99. The power supply 99 is configured to generate a DC voltage or a high frequency voltage to be applied to the focus ring FR. A negative voltage may be applied from the power supply 99 to the focus ring FR.

The connecting member 27 is disposed on the terminal member 26t of the conductive path 26. The connecting member 27 electrically connects the focus ring FR and the terminal member 26t. The connecting member 27 disposed on the terminal member 26t faces a surface FRS of the focus ring FR. The surface FRS extends at a radially outer side of the connecting member 27 and faces a radially inner side.

In one embodiment, the focus ring FR may have a first annular portion FR1 and a second annular portion FR2. The first annular portion FR1 has an annular plate shape, and is disposed on the second support region 162 (i.e., on the chuck region 22). In the plasma processing apparatus 1, the substrate W is disposed in a region surrounded by the first annular portion FR1. The second annular portion FR2 provides the surface FRS. The second annular portion FR2 extends downward from the outer peripheral portion of the first annular portion FR1 to face the connecting member 27.

The holder 25 presses the connecting member 27 downward and holds the connecting member 27 to press the surface FRS of the focus ring FR against the connecting member 27. In the substrate support 16, since the connecting member 27 is pressed downward by the holder 25, the connecting member 27 and the terminal member 26t are electrically connected reliably. The connecting member 27 held by the holder 25 presses the surface FRS of the focus ring FR which is positioned at a radially outer side of the connecting member 27. Therefore, the connecting member 27 and the focus ring FR are electrically connected reliably. Further, the connecting member 27 presses the surface FRS of the focus ring FR in a direction substantially orthogonal to a direction in which the electrostatic attractive force generated between the chuck region 22 and the focus ring FR is exerted. Accordingly, an electrical path that can be connected to the focus ring FR while suppressing generation of a force against the electrostatic attractive force for holding the focus ring FR is provided. In this substrate support 16, the focus ring FR is stably held in the second support region 162. Even when the heat transfer gas is supplied to the gap between the focus ring FR and the chuck region 22, the focus ring FR is stably held in the second support region 162. Thus, the pressure of the heat transfer gas supplied to the gap between the focus ring FR and the chuck region 22 can be increased, which makes it possible to improve the temperature control efficiency of the focus ring FR.

In one embodiment, the connecting member 27 may have a first portion 271 and a second portion 272. The first portion 271 faces the surface FRS of the focus ring FR. The second portion 272 extends from the lower end of the first portion 271. The second portion 272 extends radially outward from the lower end of the first portion 271. In this embodiment, the connecting member 27 has an L-shaped cross section.

The holder 25 holds the connecting member 27 to press the second portion 272 downward. In one embodiment, the holder 25 is disposed on the insulating member 94. The holder 25 is fixed to the insulating member 94 by a screw 28. In one embodiment, the holder 25 includes a main portion 251 and a protruding portion 252. The main portion 251 has a substantially cylindrical shape. The main portion 251 is disposed on the insulating member 94. The protruding portion 252 protrudes radially inward from the upper end of the main portion 251. The protruding portion 252 is disposed on the second portion 272 of the connecting member 27. When the holder 25 is fixed, the second portion 272 of the connecting member 27 is pressed downward and, thus, the first portion 271 exerts a force radially outward. Accordingly, the connecting member 27 and the focus ring FR can be reliably brought into contact with each other.

In one embodiment, the substrate support 16 may further include a conductive member 58. The conductive member 58 has conductivity and elasticity. The conductive member 58 may be, e.g., a spiral spring gasket made of a conductor.

The conductive member 58 is held between the connecting member 27 and the terminal member 26t.

In one embodiment, the substrate support 16 may further include a conductive member 59. The conductive member 59 has conductivity and elasticity. The conductive member 59 may be, e.g., a spiral spring gasket made of a conductor. The conductive member 59 is held between the connecting member 27 and the surface FRS of the focus ring FR. In another embodiment, the first portion 271 of the connecting member 27 may be elastic and may exert a force to the surface FRS of the focus ring FR.

In one embodiment, the holder 25 may have an insulating property. The holder 25 is made of, e.g., quartz or aluminum oxide. The holder 25 and the focus ring FR (i.e., the second annular portion FR2) shield the connecting member 27 from the plasma. In this embodiment, the connecting member 27 is protected from the plasma.

While various embodiments have been described above, various omissions, substitutions, and changes may be made without being limited to the above-described embodiments. It is also possible to combine the elements in different embodiments to form other embodiments.

For example, the plasma processing apparatus 1 is a capacitively coupled plasma processing apparatus. However, the plasma processing apparatus according to another embodiment may be another plasma processing apparatus. Such a plasma processing apparatus may be any plasma processing apparatus. Such a plasma processing apparatus may be an inductively coupled plasma processing apparatus, a plasma processing apparatus that generates plasma by surface waves such as microwaves, or the like.

In another embodiment, the chuck region 22 may have three or more electrodes to generate an electrostatic attractive force.

In the example shown in FIG. 3, a positive voltage is applied to both of the first electrode 221 and the second electrode 222. However, the polarity of the voltage applied to the first electrode 221 and the second electrode 222 is not limited as long as a potential difference is generated between the first electrode 221 and the second electrode 222. A potential of one of the first electrode 221 and the second electrode 222 may be 0 V. A single power supply may be used to generate a potential difference between the first electrode 221 and the second electrode 222.

The number of the connecting member 27 is not limited. A plurality of connecting members 27 may be used for electrical connection between the terminal member 26t and the focus ring FR. The connecting members 27 may be arranged along the circumferential direction. The connecting members 27 may be arranged at equal intervals along the circumferential direction.

Next, a power feed structure for the focus ring will be described.

Figure 8:
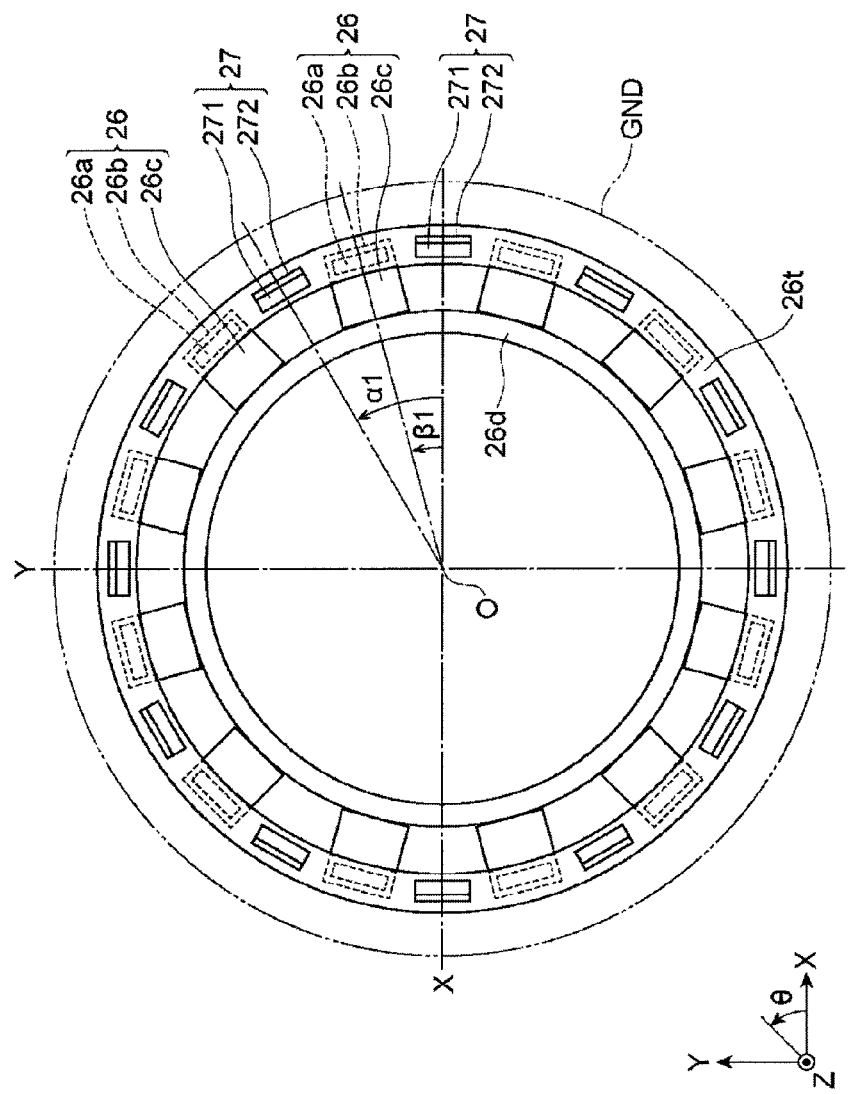
FIG. 8 is a plan view of a power feed structure according to an embodiment.
Figure 9:
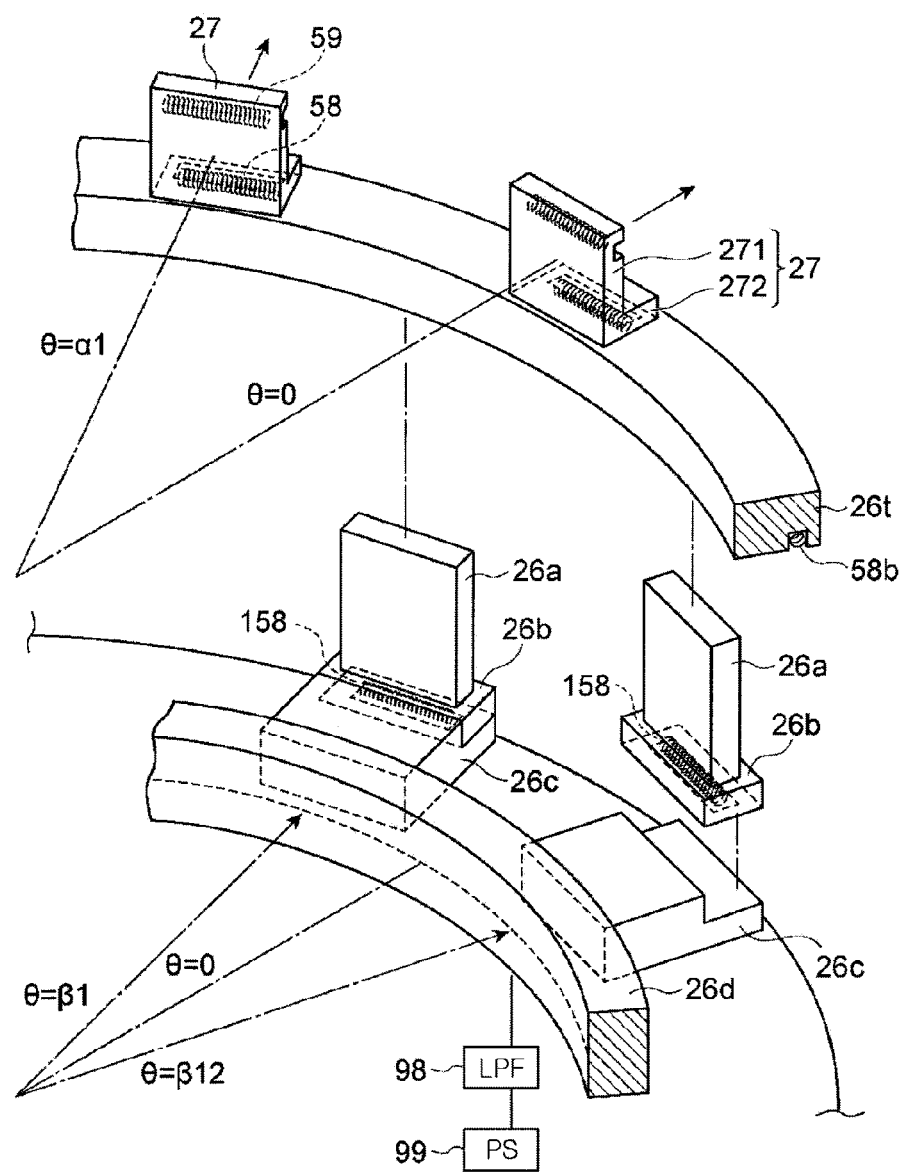
FIG. 9 is an exploded perspective view showing a part of the power feed structure according to the embodiment.

FIG. 8 is a plan view of a power feed structure according to one embodiment. FIG. 9 is an exploded perspective view showing a part of the power feed structure according to the embodiment. An XYZ three-dimensional orthogonal coordinate system is set. A vertical direction is set to the Z-axis direction, and two orthogonal axes that define a horizontal plane are set to the X-axis and the Y-axis. An angle θ of the connecting member 27 on the X axis is set to 0°.

This power feed structure includes a first connecting member group (the connecting members 27), the first terminal member 26t, a second connecting member group (the connecting members 26a to 26c: see FIG. 9), and the second terminal member 26d.

The first connecting member group includes the connecting members 27 arranged at equal intervals along the circumferential direction of the focus ring. In this example, twelve connecting members 27 are arranged along the circumferential direction. Each of the connecting members 27 has an L shape in the longitudinal cross section parallel to the radial direction of the focus ring. The connecting members 27 are disposed on the upper surface of the ring-shaped first terminal member 26t (see FIG. 9). A groove 59g (see FIG. 11) for holding the conductive member 59 is formed on the outer surface of the first portion 271 that is the upper portion of the connecting member 27, and the groove 59g extends along the circumferential direction. The conductive member 59 is in contact with the connecting member 27 and the focus ring FR (FIG. 10) and electrically connects the connecting member 27 and the focus ring FR. The conductive member 58 (see FIG. 11) disposed below the connecting member 27 is in contact with a bottom surface of the second portion 272, which is the lower portion of the connecting member 27, and an inner wall surface of a recess 58g (groove) formed at the first terminal member 26t. The recess 58g is disposed on the upper surface of the first terminal member 26t, and the conductive member 58 is disposed in the recess 58g.

The upper surface and the bottom surface of the connecting member 27 have a substantially rectangular shape. This rectangular shape may have rounded corners, or may be deformed to a shape according to the circumferential direction of the focus ring.

A central line X that passes through the center O of the focus ring (see FIG. 8) and is parallel to the X-axis direction and a central line Y that passes through the center O of the focus ring and is parallel to the Y-axis direction are indicated by dashed dotted lines. An angle between line segments extending in the radial direction from the center O of the focus ring is defined as a pitch. In a plan view (when viewed from the Z-axis direction), the line segments passing through the centers of the connecting members 27 arranged in the circumferential direction are arranged at a pitch of an angle $\alpha 1$. In this example, since the twelve connecting members 27 are arranged at equal intervals along the circumferential direction, the angle $\alpha 1$ is 30°. In a plan view, on the assumption that a radius vector of the center of the connecting member 27 is r and polar coordinates thereof are $(r, \theta)$, the positions of the N-number of connecting members 27 are given by polar coordinates $(r, \alpha n)$. At this time, a condition "$\alpha n = \alpha 1 \times (n-1)$" is satisfied (n being an integer satisfying $1 \leq n \leq N$).

The ring-shaped first terminal member 26t is disposed below the upper connecting member 27, and the second connecting member group (the connecting members 26a to 26c) is disposed below the first terminal member 26t. The connecting members are arranged at equal intervals along the circumferential direction of the focus ring. The connecting members 26a to 26c form a part of the conductive path 26. The conductive path 26 includes the ring-shaped second terminal member 26d. A group of the connecting members 26a to 26c includes an upper conductor 26a disposed at an uppermost position, a pedestal component 26b disposed below the upper conductor 26a, and a base component 26c disposed below the pedestal component 26b. A center position of the upper conductor 26a represents a position of the connecting members 26a to 26c.

In a plan view, the line segments passing through the centers of the upper conductors 26a are arranged at a pitch of angle $\beta 1 \times 2$. In this example, since twelve upper conductors 26a are arranged at equal intervals along the circumferential direction, the angle β1 is 15° and "β1×2" is 30°. In a plan view, the position of the upper connecting member 27 and the position of the lower connecting members 26a to 26c are shifted by an angle of β1=α1/2=15° along the circumferential direction of the focus ring. In a plan view, on the assumption that the radius vectors of the centers of the connecting members 26a to 26c are r and the polar coordinates thereof are (r, θ), the positions of the K-number of connecting members 26a to 26c are given by polar coordinates (r, βk). At this time, a condition "βk=β1+α1×(k−1)" is satisfied (k being an integer satisfying 1≤k≤K). In this example, a condition "N=K=12" is satisfied.

In a plan view, the position of the connecting member 27 of the first connecting member group and the position of the connecting members 26a to 26c of the second connecting member group are shifted along the circumferential direction of the focus ring. Therefore, the distribution of the current flowing through the connecting member 27 of the first connecting member group and the distribution of the current flowing through the connecting members 26a to 26c of the second connecting member group are shifted in the circumferential direction in a plan view. Accordingly, the overall in-plane distribution of the current becomes uniform. As a result, uneven in-plane distribution of plasma (sheath electric field) can be further suppressed.

Referring to FIG. 9, the connecting member 27 is disposed on the ring-shaped first terminal member 26t. A recess (groove) 58bg (see FIG. 11) is formed on the bottom surface of the first terminal member 26t along the circumferential direction, and the conductive member 58b is disposed in the recess 58bg. The conductive member 58b extends in a ring shape. The conductive member 58b is disposed on the upper surface of the upper conductor 26a of the lower connecting member and electrically connects the first terminal member 26t and the upper conductor 26a.

The vertically long upper conductor 26a is integrally coupled to the upper surface of the horizontally long pedestal component 26b, so that the entire vertical cross section in the radial direction has an inverted T shape. A recess 158g (see FIG. 12) is formed on the bottom surface of the pedestal component 26b. A conductive member 158 is disposed in the recess 158g. The conductive member 158 electrically connects the base component 26c disposed therebelow and the pedestal component 26b disposed thereabove. The base components 26c are fixed to the outer peripheral surface of the ring-shaped second terminal member 26d while being arranged at equal intervals along the circumferential direction of the ring, and extend radially from the ring.

Here, the conductive members 59, 58, 58b, and 158 are made of an elastic spring material. Each of the conductive members may be continuous or separated. Beryllium copper is known as a conductive spring material, and can be used for a spiral spring gasket or the like. In other words, the conductive member may be a spring, e.g., a twisted strip-shaped plate spring, and can also serve as a sealing material.

As described above, the above-described power feed structure has the multiple connecting members 27 that are arranged along the circumferential direction of the focus ring to apply a bias potential to the focus ring disposed in the processing chamber of the plasma processing apparatus. Further, the first terminal member 26t has a ring shape and is electrically connected to the connecting members 27.

When the bias potential is applied to the focus ring, the high frequency power for plasma generation is superimposed on a bias potential supply line. When there is one bias potential supply line, the superimposed high frequency power flows through the supply line and the in-plane distribution of plasma becomes non-uniform. On the other hand, in the present embodiment, the connecting members 27 are arranged along the circumferential direction of the focus ring and electrically connected to the ring-shaped first terminal member 26t. Therefore, the circumferential distribution of the high frequency power flowing through the connecting members 27 can become uniform. Accordingly, the uneven in-plane distribution of plasma can be suppressed.

The high frequency power that generates plasma flows from the focus ring toward the conductive member 59, the connecting member 27, the conductive member 58, the first terminal member 26t, the conductive member 58b, the upper conductor 26a, the pedestal component 26b, the base component 26c, and the second terminal member 26d. Then, the high frequency power flows from the second terminal member 26d toward the low pass filter 98. Since the low pass filter 98 removes high frequency components, the power supply 99 connected to the low pass filter 98 is protected from a high frequency current or a high frequency voltage.

The first terminal member 26t is separated from the inner wall surface (GND in FIG. 8) of the processing chamber to which a fixed potential is applied. The first terminal member 26t serving as a supply line to which a bias potential is applied is affected by the potential of the processing chamber. The potential of the processing chamber is set to a fixed potential such as a ground potential or the like. Therefore, when the ring-shaped first terminal member 26t is separated from the inner wall surface (GND in FIG. 8) of the processing chamber, the potential of the first terminal member 26t is stabilized in the circumferential direction. Accordingly, the uneven in-plane distribution of plasma can be further suppressed. The inner wall surface of the processing chamber has a polygonal or a circular planar shape, and the outer peripheral surface of the first terminal member 26t has a polygonal or a circular planar shape. The separation distance is substantially constant in the circumferential direction. In the case of the circular shape, they are axially symmetrical with respect to the Z-axis. In the case of the polygonal shape, they are plane-symmetrical in multiple longitudinal cross sections passing through the Z-axis. In the case of a symmetrical shape, the uneven distribution of plasma can be further suppressed.

As described above, the power supply structure of this example includes the ring-shaped second terminal member 26d separated from the first terminal member 26t and electrically connected to the first terminal member 26t. The first terminal member 26t and the second terminal member 26d are physically and electrically connected by the second connecting member group including the connecting members 26a to 26c. This structure includes the ring-shaped second terminal member 26d and the second connecting member group including the connecting members 26a to 26c. Therefore, similarly to the case of the ring-shaped first terminal member 26t and the first connecting member group, the circumferential distribution of the high frequency power flowing therethrough can become uniform. By providing the ring-shaped terminal members at multiple stages, the in-plane uneven distribution of plasma can be further suppressed.

Next, the assembled structure of the above-described members will be further described.

Figure 10:
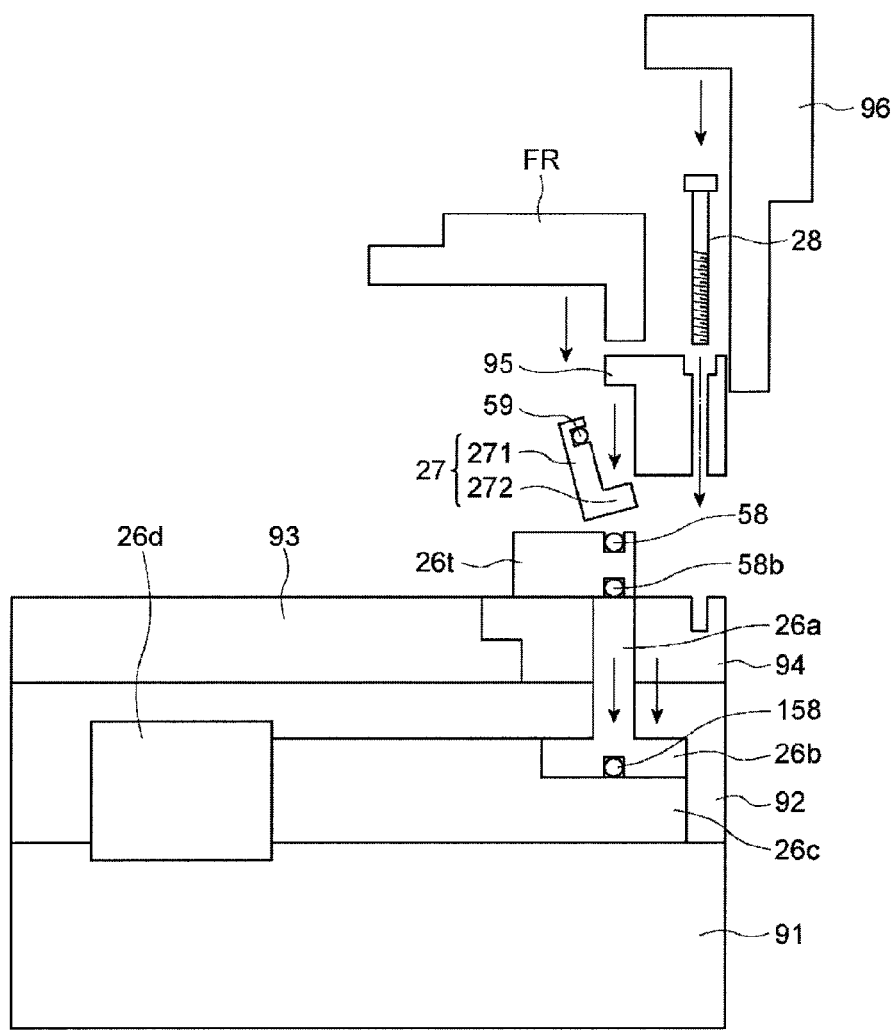
FIG. 10 is an exploded longitudinal cross-sectional view of the power feed structure according to the embodiment.

FIG. 10 is an exploded longitudinal cross-sectional view of the power feed structure according to the embodiment, and explains assembly of the structure shown in FIG. 3.

For assembly, first, the second terminal member 26d integrated with the base component 26c is disposed on the insulating member 91. The connecting member including the pedestal component 26b and the upper conductor 26a and having an inverted T shape is disposed on the base part 26c via the conductive member 158. Next, the insulating member 92 is disposed to press the upper surface of the pedestal component 26b. The insulating member 92 is opened at a portion through which the upper conductor 26a passes. The insulating member 93 is disposed on the insulating member 92. The insulating member 93 has a stepped portion at a peripheral portion thereof. The ring-shaped insulating member 94 is disposed to be engaged with the stepped portion. The insulating member 94 is opened at a portion through which the upper conductor 26a passes. Then, the first terminal member 26t is disposed on the upper surface of the upper conductor 26a via the conductive member 58b. The conductive member 58 is disposed in the recess on the upper surface of the first terminal member 26t.

Next, the L-shaped connecting member 27 is disposed on the upper surface of the first terminal member 26t via the conductive member 58. The outer upper surface of the L-shaped connecting member 27 is pressed downward by the insulating member 95 constituting a pressing member. Accordingly, the L-shaped connecting member 27 rotates outward with the lower corner of the L shape as the rotational axis, and the conductive member 59 disposed on the upper portion of the connecting member 27 is brought into contact with the lower inner surface of the focus ring FR. The insulating member 95 is provided with a hole into which the screw 28 is inserted. The screw 28 is screwed into a screw hole formed at the upper portion of the insulating member 94. The cylindrical insulating member 96 having a rim at an upper portion thereof is disposed on the insulating member 95. The rim presses the upper surface of the insulating member 95, and the inner surface of the cylindrical insulating member 96 is fitted while sliding on the outer peripheral surfaces of the insulating members 95, 94 and 92, thereby restricting the radial movement of these members. Further, the rim has a function of pressing these members downward.

Figure 11:
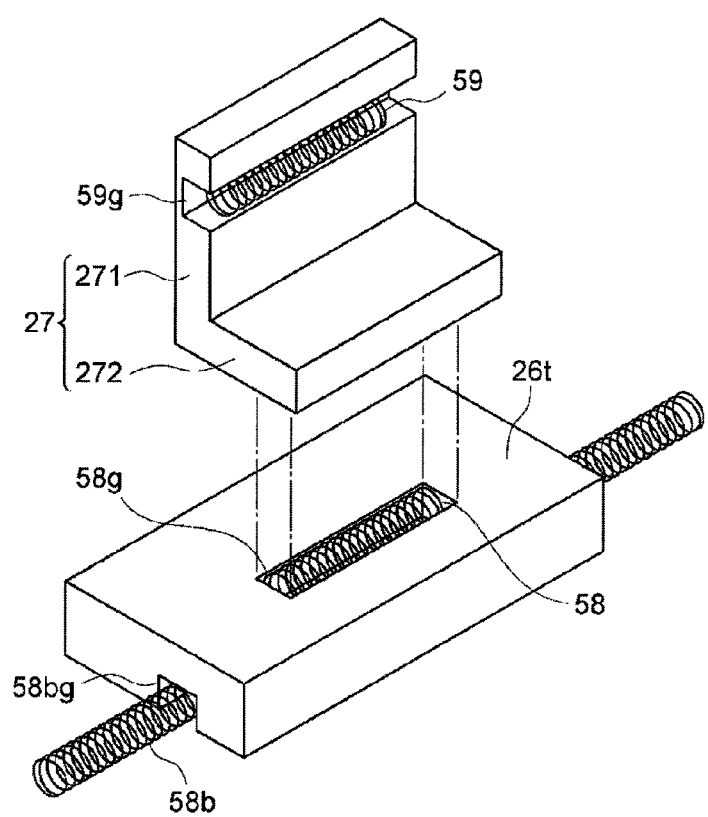
FIG. 11 is an exploded perspective view showing a connecting member disposed at an upper portion of the power feed structure.

FIG. 11 is an exploded perspective view showing the connecting member disposed at an upper portion of the power feed structure.

As described above, the recess 58g extending in the circumferential direction of the ring is formed on the upper surface of the ring-shaped first terminal member 26t, and the conductive member 58 is disposed in the recess 58g. The conductive member 58b is disposed in the recess 58bg formed on the bottom surface of the first terminal member 26t. The width of the groove 59g formed at the L-shaped connecting member 27 may be constant. Alternatively, both end portions of the groove 59g may be slightly narrowed so that the conductive member 59 is not easily separated from the groove 59g.

Figure 12:
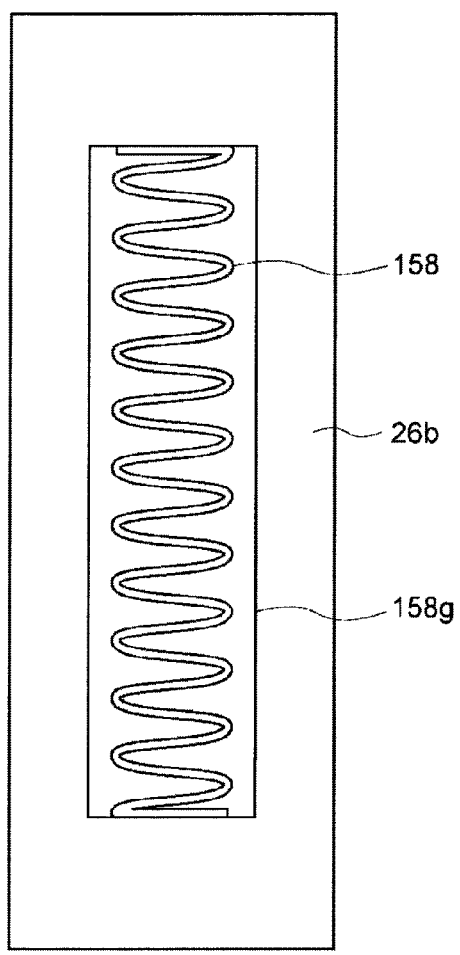
FIG. 12 is a bottom view of a connecting member disposed at a lower portion of the power feed structure.

FIG. 12 is a bottom view of the connecting member disposed at a lower portion of the power feed structure. The pedestal component 26b is disposed at the lower portion of the connecting member, and the recess 158g is formed at the bottom surface thereof. The longitudinal direction of the recess 158g extends along the circumferential direction or the tangential direction of the contour of the outer peripheral of the ring-shaped second terminal member 26d.

The above-described power feed structure can be variously modified.

Figure 13:
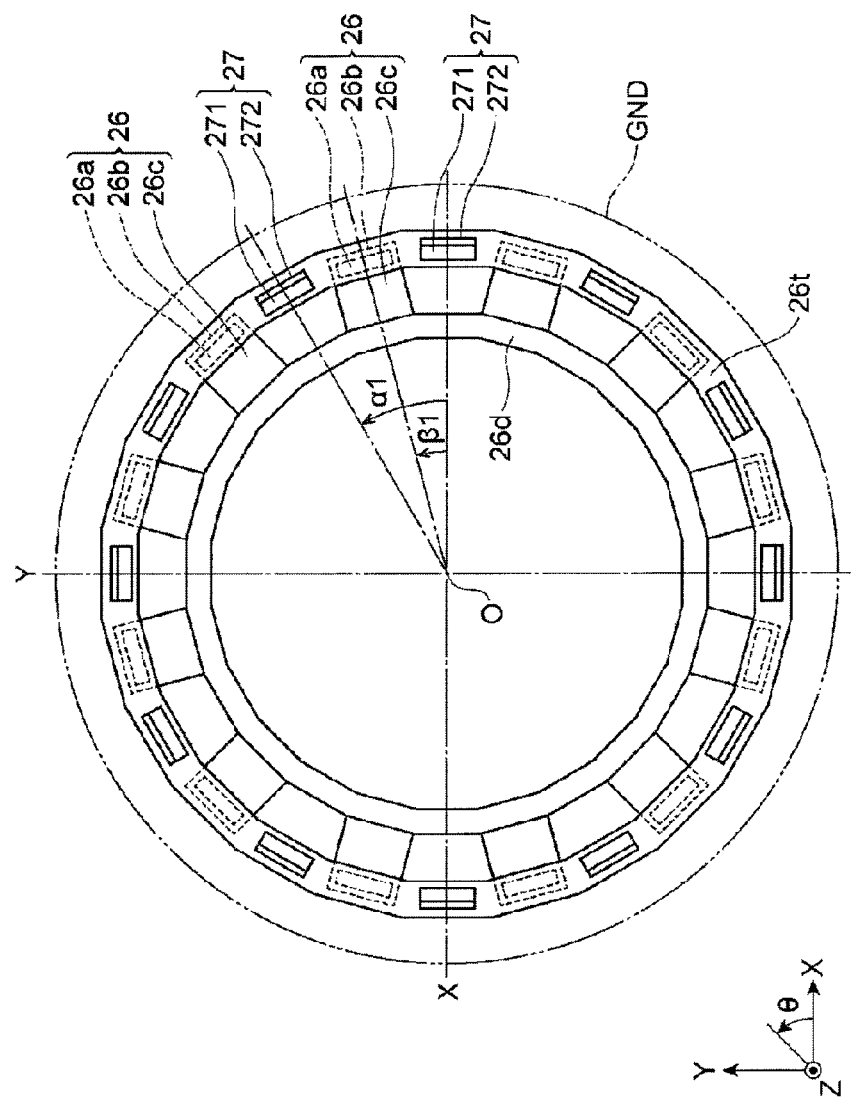
FIG. 13 is a plan view of a power feed structure according to another embodiment.

FIG. 13 is a plan view of a power feed structure according to another embodiment. The power feed structure shown in FIG. 13 is different from the power feed structure shown in FIG. 8 in the shapes of the ring-shaped first terminal member 26t and the second terminal member 26d. In FIG. 8, they have a circular shape. In this example, they have a polygonal shape (24-gonal shape). The base component 26c projects vertically from the outer peripheral surface of the second terminal member 26d. In a plan view, the connecting member 27 extends in parallel with the inner wall surface of the ring-shaped first terminal member 26t. When the ring-shaped first terminal member 26t and the ring-shaped second terminal member 26d have a circular shape, stress is applied evenly and excellent physical durability is obtained. When they have a polygonal shape, the connecting members may be installed in parallel to the inner wall surface or the outer wall surface in a plan view, which makes the alignment thereof easier. The polygonal shape is not necessarily a 24-gonal shape.

Figure 14:
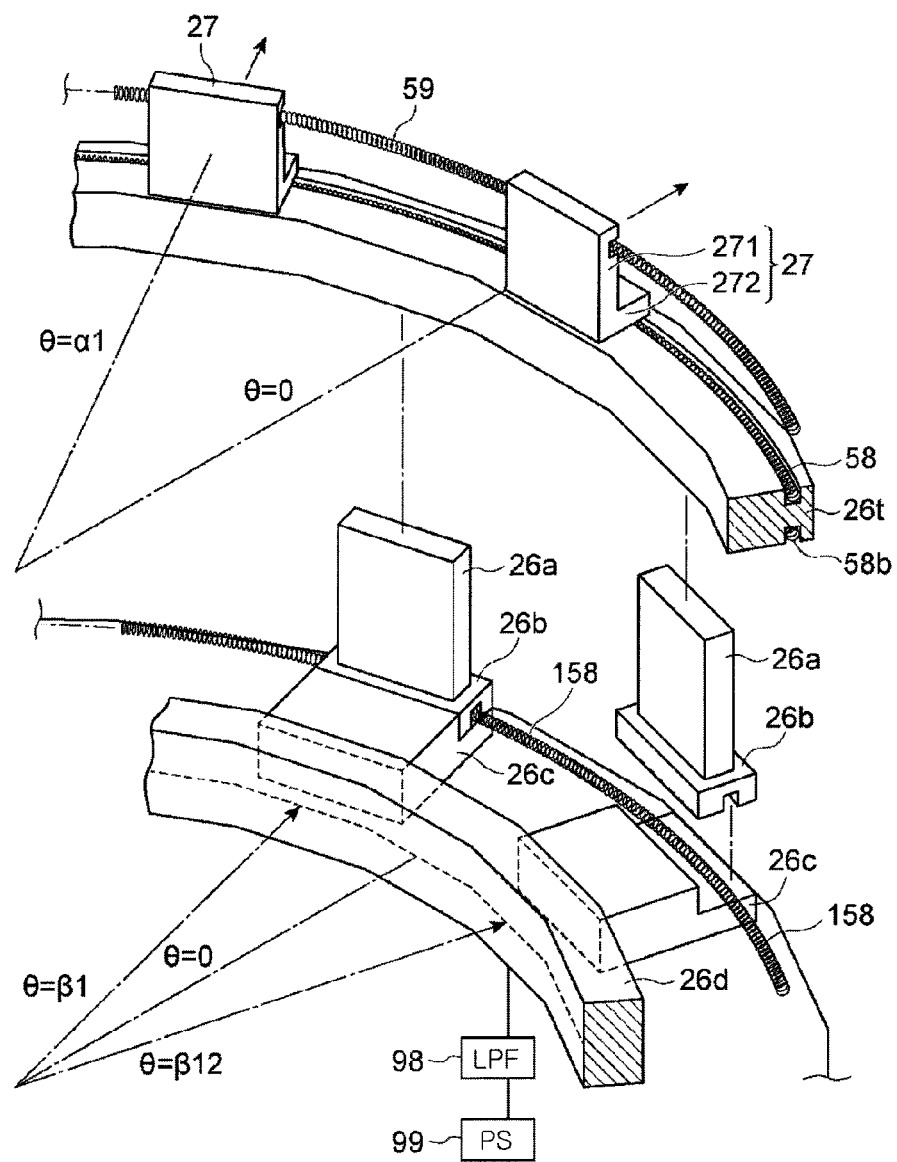
FIG. 14 is an exploded perspective view showing a part of the power feed structure according to still another embodiment.
Figure 15:
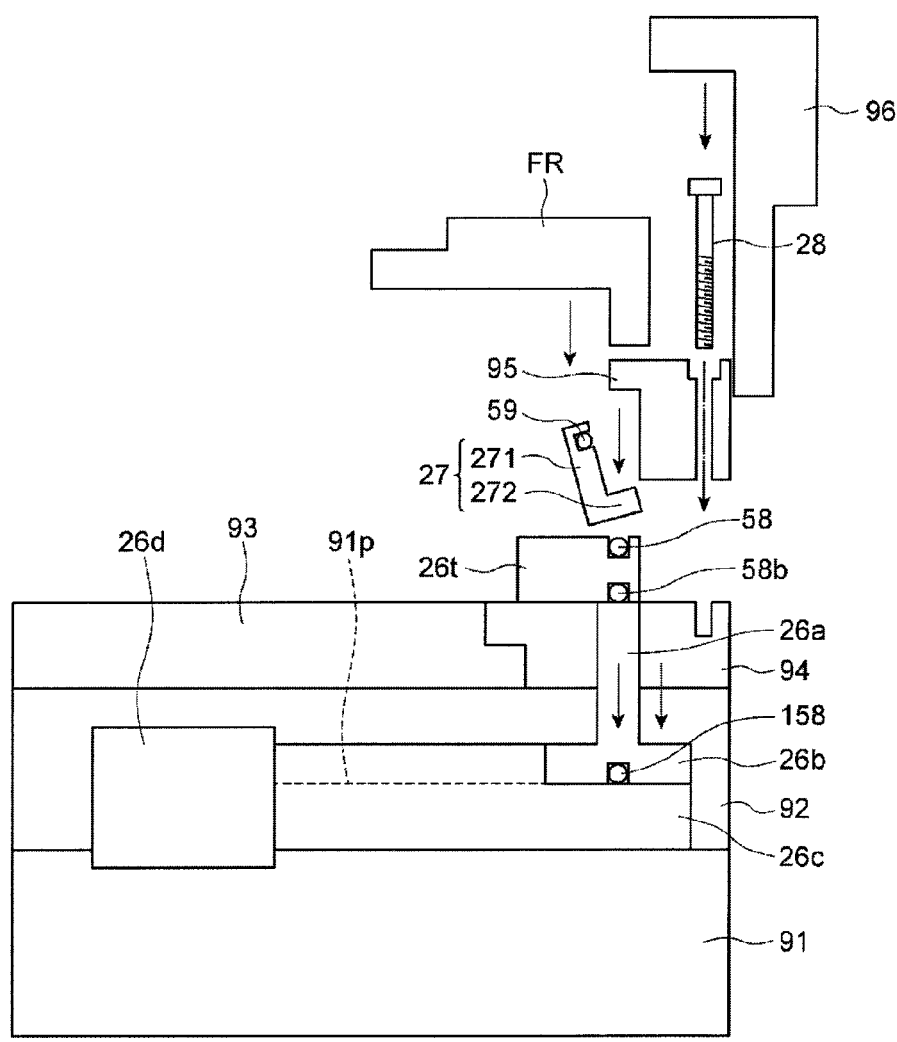
FIG. 15 is an exploded longitudinal cross-sectional view of a power feed structure according to the still another embodiment.

FIG. 14 is an exploded perspective view of a part of the power feed structure according to the embodiment which is shown in FIG. 13. FIG. 15 is a longitudinal cross-sectional view of a power feed structure according to another embodiment.

The structure of FIG. 14 is the same as that shown in FIG. 9 except that the conductive members 59, 58, and 158 have a ring shape extending in the circumferential direction. In this structure, an insulating member 91p (see FIG. 15) disposed below the conductive member 158 to support the conductive member 158 or a protrusion from the insulating member 91 is required in the region between the lower connecting members. In the structure shown in FIG. 14, the conductive members 59, 58, and 158 have a ring shape, and thus can be easily handled at the time of assembly. On the other hand, when the conductive members 158 are arranged at multiple locations as shown in FIG. 9, the insulating member 91p for supporting the conductive members 158 is not required.

The above-described plasma processing apparatus can include any one of the above-described power feed structures, and can suppress the uneven in-plane distribution of plasma.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A power feed structure comprising:
a first connecting member group including a plurality of first connecting members arranged along a circumferential direction of a focus ring disposed in a processing chamber of a plasma processing apparatus to apply a bias potential to the focus ring;
a ring-shaped first terminal member electrically connected to the first connecting members;
a ring-shaped second terminal member separated from the ring-shaped first terminal member and electrically connected to the ring-shaped first terminal member; and
a second connecting member group including a plurality of second connecting members connected to the ring-shaped first terminal member and the ring-shaped second terminal member.

2. The power feed structure of claim 1, wherein the ring-shaped first terminal member is separated from an inner wall surface of the processing chamber to which a fixed potential is applied.

3. The power feed structure of claim 2, wherein positions of the first connecting members of the first connecting member group and positions of the second connecting members of the second connecting member group are shifted along a circumferential direction of the focus ring in a plan view.

4. The power feed structure of claim 1, wherein positions of the first connecting members of the first connecting member group and positions of the second connecting members of the second connecting member group are shifted along a circumferential direction of the focus ring in a plan view.

5. A plasma processing apparatus comprising:
a chamber;
a substrate support provided in the chamber;
a focus ring supported on the substrate support;
a first connecting member group including a plurality of first connecting members arranged along a circumferential direction of the focus ring to apply a bias potential to the focus ring;
a ring-shaped first terminal member electrically connected to the first connecting members;
a ring-shaped second terminal member separated from the ring-shaped first terminal member and electrically connected to the ring-shaped first terminal member; and
a second connecting member group including a plurality of second connecting members connected to the ring-shaped first terminal member and the ring-shaped second terminal member.

6. The plasma processing app us of claim 5, wherein the ring-shaped first terminal member is separated from an inner wall surface of the chamber to which a fixed potential is applied.

7. The plasma processing apparatus of claim 6, wherein positions of the first connecting members of the first connecting member group and positions of the second connecting members of the second connecting member group are shifted along a circumferential direction of the focus ring in a plan view.

8. The plasma processing apparatus of claim 5, wherein positions of the first connecting members of the first connecting member group and positions of the second connecting members of the second connecting member group are shifted along a circumferential direction of the focus ring in a plan view.

* * * * *